(12) United States Patent
Nguyen et al.

(10) Patent No.: US 7,138,714 B2
(45) Date of Patent: Nov. 21, 2006

(54) VIA BARRIER LAYERS CONTINUOUS WITH METAL LINE BARRIER LAYERS AT NOTCHED OR DIELECTRIC MESA PORTIONS IN METAL LINES

(75) Inventors: Du B. Nguyen, Danbury, CT (US); Birendra N. Agarwala, Hopewell Junction, NY (US); Conrad A Barile, Wappingers Falls, NY (US); Jawahar P. Nayak, Wappingers Falls, NY (US); Hazara S. Rathore, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,265

(22) Filed: Feb. 11, 2005

(65) Prior Publication Data
US 2006/0180930 A1    Aug. 17, 2006

(51) Int. Cl.
*H01L 23/535* (2006.01)
(52) U.S. Cl. .................................. 257/751; 257/E23.151
(58) Field of Classification Search ................ 257/758, 257/767, 775
See application file for complete search history.

(56) References Cited

U.S. PATENT DOCUMENTS

| | | | |
|---|---|---|---|
| 6,157,081 A * | 12/2000 | Nariman et al. | 257/752 |
| 6,433,429 B1 * | 8/2002 | Stamper | 257/751 |
| 6,492,270 B1 * | 12/2002 | Lou | 438/687 |
| 6,750,541 B1 * | 6/2004 | Ohtsuka et al. | 257/750 |
| 6,753,610 B1 * | 6/2004 | Fukiage | 257/762 |
| 6,806,579 B1 * | 10/2004 | Cowley et al. | 257/762 |
| 6,821,879 B1 * | 11/2004 | Wong | 438/618 |
| 6,828,223 B1 * | 12/2004 | Chuang | 438/622 |
| 6,942,546 B1 * | 9/2005 | Desai et al. | 451/8 |
| 6,958,291 B1 * | 10/2005 | Yu et al. | 438/637 |
| 2005/0029669 A1 * | 2/2005 | Inoue et al. | 257/774 |

* cited by examiner

*Primary Examiner*—Eddie Lee
*Assistant Examiner*—Andrew O. Arena
(74) *Attorney, Agent, or Firm*—Scully, Scott, Murphy & Presser, P.C.; Steven Capella, Esq.

(57) ABSTRACT

The present invention provides an interconnect structure that includes a diffusion barrier which is positioned within the structure in a fashion that increases the reliability and lifetime of the interconnect structure.

10 Claims, 7 Drawing Sheets

VIA BARRIER LAYERS CONTINUOUS WITH METAL LINE BARRIER LAYERS AT NOTCHED OR DIELECTRIC MESA PORTIONS IN METAL LINES

BACKGROUND OF THE INVENTION

Field of the Invention

The present invention relates to an interconnect having a diffusion barrier positioned to increase the reliability and lifetime of the interconnect. More particularly, the present invention provides a copper via interconnect having an interconnect diffusion barrier aligned with a metal diffusion barrier of an underlying metal line to which the copper via interconnect is in electrical contact.

Generally, semiconductor devices include a plurality of integrated circuits (ICs). ICs can be useful for many applications including computers and electronic equipment and they can contain millions of transistors and other circuit elements that can be fabricated on a single semiconductor chip. For device functionality, a complex of signal paths will typically be routed to connect the circuit elements distributed on the surface of the semiconductor device. Efficient routing of these signals across the device can become more difficult as the complexity and number of ICs is increased. Thus, the formation of multi-level or multi-layered interconnect schemes have become more desirable due to their efficiency in providing high-speed signal routing patterns between a large number of transistors on a single semiconductor chip. The preferred interconnect metal is copper.

In fabricating IC wiring with a multi-level scheme, an insulating material (oftentimes referred to as a dielectric material) such as $SiO_2$, will normally be patterned to provide trenches that are subsequently filled with conductive material to provide metal lines for electrical connectivity. Prior to the deposition of the conductive material, a conformal diffusion barrier, often referred as a liner, is formed along the base and sidewalls of the trench. Following the formation of the diffusion barrier, a metal, such as copper, is deposited within the trench and planarized to provide metal lines.

Figure 1:
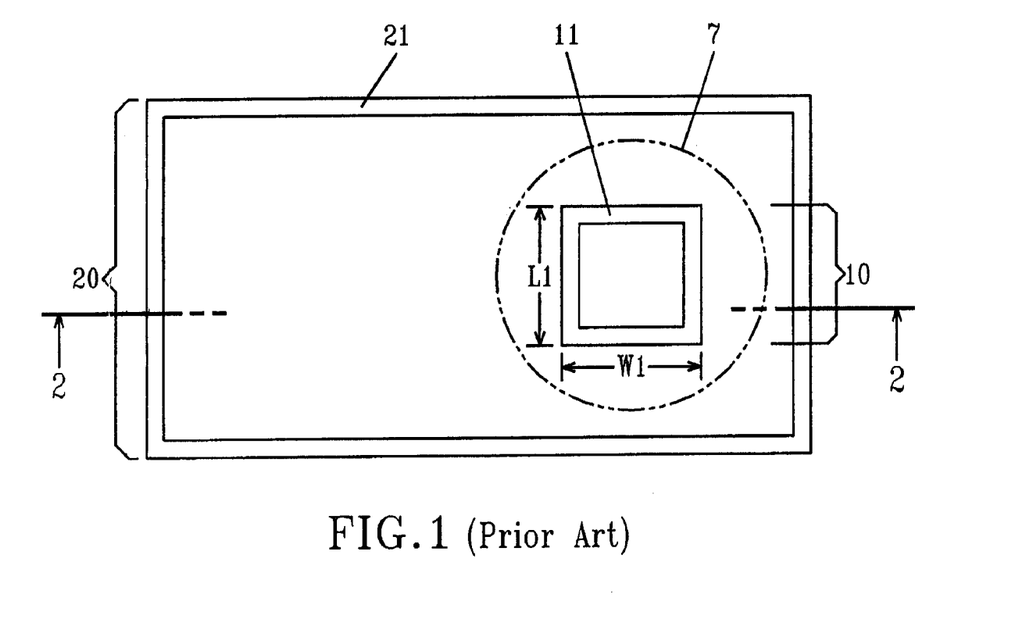
FIG. 1 illustrates (through a top view) a prior via interconnect to a metal line, wherein the via makes contact to the underlying line in the middle of the line. The via liner does not make any contact to the liner of the line. This structure results in an open circuit failure as the electromigration void is formed under the via.
Figure 2:
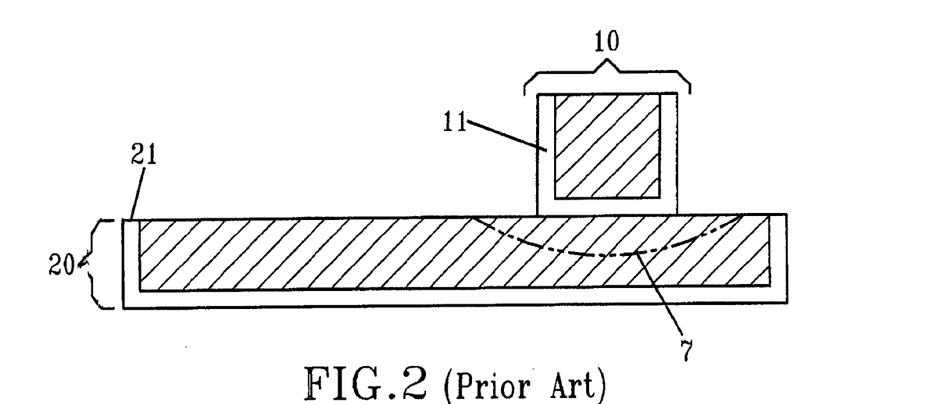
FIG. 2 illustrates the cross-section of the structure depicted in FIG. 1 along section line 2,2.

A dielectric layer is then blanket deposited atop the metal lines and the insulating material. The dielectric layer is then normally patterned to create openings for conductive lines and/or vias using photolithography and etching. A diffusion barrier (liner) is then formed along the sidewalls and the base of the via and a metal, such as copper, is deposited within the vias to be in electrical contact with the metal line, as depicted in FIGS. 1 and 2. The diffusion barrier material typically comprises TaN and/or Ta.

Copper, despite having a low resistance suitable for electrical connectivity in high-speed devices, is susceptible to electromigration. Contrary to copper, Ta or TaN is substantially less susceptible to electromigration and serves as a barrier for copper diffusion.

A typical prior IC design is shown in FIG. 1 which consists of vias 10 to the metal lines 20, wherein to vias 10 has dimensions, such as the vias' width W1 and length L1, contained within the metal line 20 to which the via 10 is electrically connected. In this arrangement, the diffusion barrier 11 of the via 10 does not contact the diffusion barrier 21 of the metal line 20. One disadvantage of this prior IC design, as illustrated in FIG. 2, is that when electrical current is flowing through the interconnect the copper of the metal line 20 is depleted away from the interface between the metal line 20 and the via 10 due to electromigration. With increasing electromigration of copper from the interface of the via 10 and the metal line 20, a void 7 can form between the via 10 and the metal line 20 resulting in an open circuit due to a lack of electrical connection between the via and the underlying line.

Previously, the electromigration of copper has limited circuit designers to a relatively low current density, since high-current density increases the electromigration of copper, therefore effectively reducing the lifetime of the interconnect. Low current density reduces device speed and performance. Current and future devices require interconnects capable of higher current densities.

In view of the drawbacks mentioned above with prior art diffusion barriers, there is a continued need for developing a new and improved interconnect that can provide increased reliability and lifetime at high current density.

SUMMARY OF THE INVENTION

The present invention provides an interconnect structure to metal lines useful in semiconductor electronic devices having increased lifetime and reliability. The inventive interconnect structure increases the lifetime and reliability of the connection between the via and the underlying metal line by designing some specific underlying line geometry and via placement to allow maintaining electrical contact between the liners within the via and within the line trench. In one aspect of the present invention, the early open circuit failure is controlled by joining the diffusion barrier in the metal via interconnect and the diffusion barrier of the metal line to provide a continuous liner contact between the via interconnect and the metal line.

Broadly, the inventive interconnect structure comprises:

a metal wiring level comprising metal lines within an intralevel dielectric, said metal lines having a first portion with a first width and a notched portion having a second width, said first width is greater than said second width, wherein said metal lines are separated from said intralevel dielectric by a metal diffusion barrier; and a via interconnect level atop said metal wiring level comprising a via interconnect within an interlevel dielectric, said via interconnect is separated from said interlevel dielectric and in electrical contact to said metal lines of said metal wiring level through a via diffusion barrier, wherein said via diffusion barrier contacts said metal diffusion barrier within said notched portion of said metal line.

In accordance with the present invention, the via diffusion barrier and the metal diffusion barrier comprise a metal selected from tantalum, tungsten, ruthenium, cobalt, or titanium. The via diffusion barrier and the metal diffusion barrier may further comprise nitrided compounds of the elements mentioned above.

In another embodiment of the present invention, a continuous metal diffusion barrier between the metal line and the via interconnect is provided by a dielectric island positioned within the metal line, in which the portion of the metal diffusion barrier positioned on the sidewalls of the dielectric island (mesa portion of intralevel dielectric) within the metal line in conjunction with the via diffusion barrier provide a continuous liner contact between the via interconnect and the metal line.

Broadly, this embodiment of the inventive interconnect structure comprises:

a metal wiring level comprising metal lines within an intralevel dielectric, said metal lines having a mesa portion of said intralevel dielectric positioned within a portion of said metal lines, wherein said metal lines are separated from said intralevel dielectric and said mesa portion of said intralevel dielectric by a metal diffusion barrier; and a via interconnect level atop said metal wiring level comprising a via interconnect through an interlevel dielectric, said via interconnect separated from said interlevel dielectric and in electrical contact to said metal lines of said metal wiring level through a via diffusion barrier, wherein said via diffusion barrier contacts said metal diffusion barrier within said mesa portion of said metal lines.

Another aspect of the present invention is a method of forming the above-described structures. Broadly, the inventive method comprises the steps of:

forming trenches in an intralevel dielectric atop a substrate;
forming a conformal metal diffusion barrier along sidewalls and a base of said trench;
forming metal lines atop said metal diffusion barrier within said trench planar to an upper surface of said intralevel dielectric;
forming an interlevel dielectric layer atop said intralevel dielectric having vias to said metal lines;
forming a conformal via diffusion barrier (liner) along sidewalls and base of said vias, wherein said conformal via diffusion barrier is in contact with said metal diffusion barrier where said vias contact said metal lines; and
depositing a conductive material within said vias.

BRIEF DESCRIPTION OF THE DRAWINGS

FIG. 5($a$) illustrates the cross section of the structure of FIG. 3 along section line 5,5, in which the cross section represents the interface between the via interconnect level and the metal wiring level. In this embodiment of the present invention, the alignment of the via diffusion barrier of the via interconnect to the metal diffusion barrier in the notched portion of the metal line substantially eliminates failure due to the depletion of metal due to electromigration underneath the via.

FIG. 5($b$) illustrates another embodiment of the present invention. The alignment of the via diffusion barrier of the via interconnect to the metal diffusion barrier positioned along the sidewalls of a mesa portion of intralevel dielectric within the metal lines eliminates the failures due to the depletion of metal away from the via interconnect.

FIG. 5($b$) illustrates the cross section of the structure of FIG. 3 along section line 5,5, in which the cross section represents the interface between the via interconnect level and the metal wiring level. In this embodiment of the present invention, the alignment of the via diffusion barrier of the via interconnect to the metal diffusion barrier positioned along the sidewalls of a mesa portion of intralevel dielectric within the metal lines eliminates the electro-migration of metal away from the via interconnect.

FIG. 8($a$) illustrates the cross section of the structure of FIG. 7 along section line 8,8, in which the cross section represents the top surface of the structure depicted in FIG. 7. In this embodiment of the present invention, trenches are formed within the intralevel dielectric having a notched portion substantially aligned to the via interconnect.

FIG. 8($b$) illustrates another embodiment of the cross section of the structure of FIG. 7 along section line 8,8. In this embodiment of the present invention, the via diffusion barrier is aligned to the metal diffusion barrier lining along the mesa portion of intralevel dielectric within the perimeter of the metal line.

FIG. 10($a$) illustrates the cross section of the structure of FIG. 9 along section line 10,10, in which the cross section represents the interface between the interconnect via level and the metal wiring level. In this embodiment of the present invention, the diffusion barrier of the interconnect is in direct contact with the metal diffusion barrier in the notched portion of the metal line.

FIG. 10($b$) illustrates the cross section of the structure of FIG. 9 along section line 10,10, in which the cross section represents the interface between the via interconnect level and the metal wiring level. In this embodiment of the present invention, the diffusion barrier of the interconnect is in direct contact to the metal diffusion barrier positioned along the sidewalls of a mesa portion of intralevel dielectric within the metal lines.

DETAILED DESCRIPTION OF THE INVENTION

The present invention, which provides an interconnect structure for electronic devices, as well as the electronic devices containing the same, and methods of fabricating the inventive interconnect structure, will now be described in greater detail by referring to the drawings that accompany the present application.

In the following discussion, the electronic device is a multi-level interconnect wiring structure. Although the discussion that follows is directed to a multi-level interconnect wiring structure the present invention works well for any electronic device that includes a substrate containing a plurality of conductive regions. In the present invention a single or dual damascene process can be used to form the interconnect structure. In the dual damascene approach, patterns are defined in at least one hardmask layer and subsequently transferred by dry etch processes into an interlevel dielectric and an interlevel dielectric. The dry etch processes includes a reactive plasma that is used to define the interlevel dielectric and interlevel dielectric.

Figure 5A:
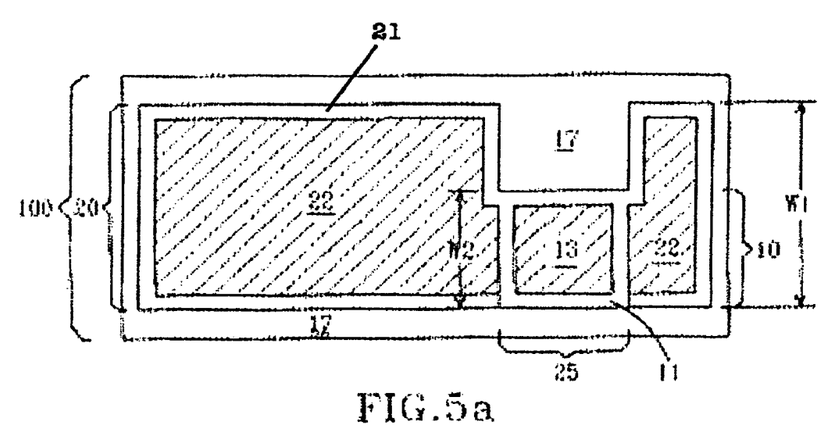

Referring to FIG. 5($a$), and in one embodiment of the present invention, an interconnect is provided in which electromigration related failure of a conductive metal, such as copper, at the interface between the via interconnect 10 and the metal line 20 is controlled by a continuous diffusion barrier positioned between the via interconnect 10 and a notched portion 25 of the metal line 20.

Figure 3:
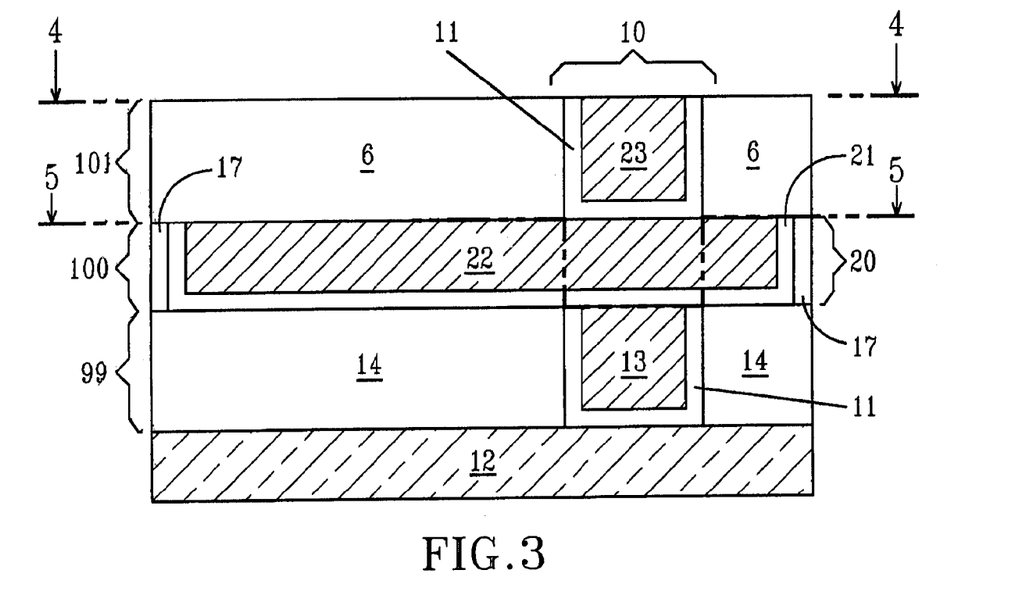
FIG. 3 illustrates (through a side profile) one embodiment of the inventive via interconnect to a metal line.

Referring to FIG. 3, the interconnect structure of the present embodiment comprises a via interconnect level 101 having at least one via interconnect 10 atop a metal wiring level 100 having metal lines 20. At least one of the via interconnects 10 is in electrical contact to the metal line 20 through a via diffusion barrier 11. It is noted that the inventive interconnect is depicted using one metal wiring level 100 and one via interconnect level 101 for the purposes of simplicity and that multiple layers of metal wiring and interconnect vias are contemplated and are therefore within the scope of the present invention. The interconnect structure may also comprise a substrate 12 and a device interconnect level 99. The substrate 12 may comprise at least one semiconductor device. The device interconnect level 99 may comprise a device interconnect extending from the metal lines 20 of the metal line level 100 to the substrate 12 through an interlevel dielectric 14. The device interconnect comprises a via diffusion barrier 11 and a conductive metal 13.

Figure 4:
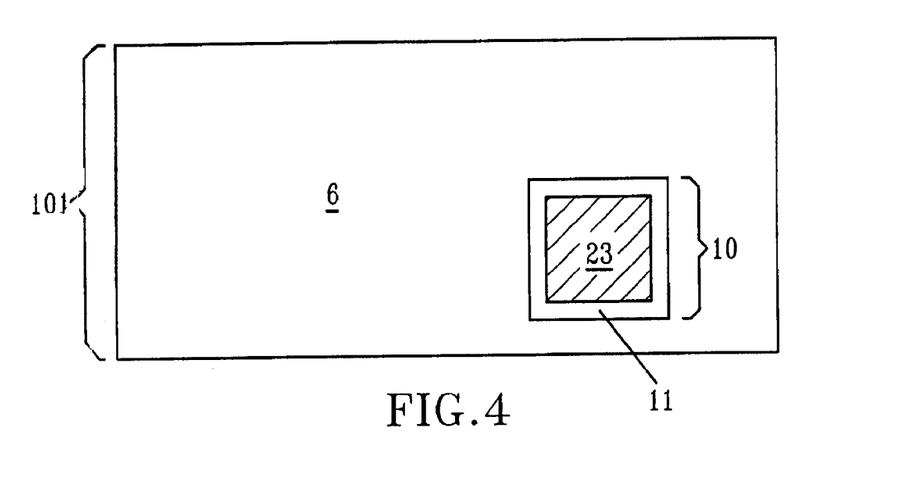
FIG. 4 illustrates the view of the structure of FIG. 3 along section line 4,4, wherein the view represents the top surface of the interconnect wiring level of the inventive interconnect structure depicted in FIG. 3.

Referring to FIG. 4, the via interconnect level 101 comprises a via interconnect 10 within an interlevel dielectric 6. The via interconnect 10 comprises a highly conductive metal 23, such as copper, and a via diffusion barrier 11. The highly conductive metal 23 of the via interconnect 10 is separated from the interlevel dielectric 6 by the via diffusion barrier 11. The via diffusion barrier 11 comprises a material, such as Ta or TaN, that functions as a barrier to the diffusion of a highly conductive metal 23, i.e., copper.

Referring to FIG. 5(a), the metal wiring level 100 of one embodiment of the present invention comprises a metal line 20 within an intralevel dielectric 17, the metal line 20 having a first portion with a first width W1 and a notch portion 25 having a second width W2, in which the first width W1 is greater than to second width W2. The metal line 20 comprises a highly conductive metal 22, such as copper, wherein the highly conductive metal 22 is separated from the intralevel dielectric 17 by a metal diffusion barrier 21. In this embodiment of the present invention, the electromigration related failure of the interconnect at the interface of to via interconnect 10 and the metal line 20 is substantially reduced by a continuous diffusion barrier present between the via interconnect 10 and the notched portion 25 of the metal line 20. The continuous diffusion barrier is provided by the via diffusion barrier 11 being in direct contact with the portion of the metal diffusion barrier 21 within the notch portion 25 of the metal line 20. The continuous diffusion barrier in the inventive interconnect, as depicted in FIGS. 3–5(a), increases the lifetime and reliability of the interconnect by about 3 to 4 times the lifetime of prior interconnect structures, as depicted in FIGS. 1 and 2.

In another embodiment of the present invention, an interconnect is provided in which the electromigration of a conductive metal at the interface between the via interconnect 10 and the. metal line 20 is controlled by a continuous diffusion barrier positioned between the via interconnect 10 and a mesa portion 40 of the intralevel dielectric 17 within the metal line 20 of the metal wiring level 100.

This embodiment of the present invention has a side profile and via interconnect level 101 similar to the previous embodiment of the present invention, as depicted in FIGS. 3 and 4. The wiring level 103 of the present embodiment, as illustrated in FIG. 5(b), differs from the wiring level 100 of the previous embodiment, as illustrated in FIG. 5(a), by the incorporation of a mesa portion 40 of intralevel dielectric 17 within the metal line 20 of the metal wiring level 100 instead of the notched portion of the metal line 20.

Figure 5B:
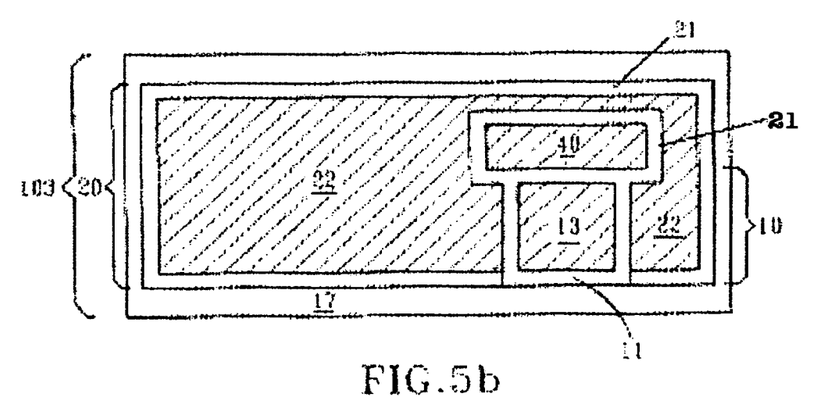

Referring to FIG. 5(b), in this embodiment of the present invention the metal wiring level 103 comprises a metal line 20 within an intralevel dielectric 17, in which a mesa portion 40 of the intralevel dielectric 17 is positioned within the perimeter of the metal line 20. The intralevel dielectric 17 may include any suitable insulating material that is typically used in interconnects to electrical devices. The metal line 20 comprises a highly conductive metal 22, such as copper, wherein the highly conductive metal 22 is separated from the intralevel dielectric 17 by a metal diffusion barrier 21, such as Ta or TaN.

In this embodiment of the present invention, the electromigration related failure metal at the interface of the via interconnect 10 and the metal line 20 is substantially reduced by a continuous diffusion barrier present between the via interconnect 10 and the mesa portion 40 of the intralevel dielectric within the metal line 20. The continuous diffusion barrier in the inventive interconnect, as depicted in FIG. 5(b), increases the lifetime and reliability of the interconnect by about 3 to 4 times the lifetime of prior interconnect structures, as depicted in FIGS. 1 and 2. The method of forming the above-described interconnect structures is now described with reference to FIGS. 6–11.

Figure 6:
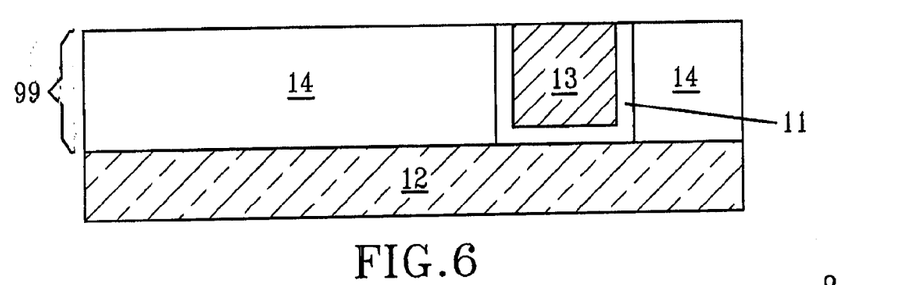
FIG. 6 illustrates (through a side profile) the initial structure, including a first interlevel dielectric atop a semiconducting wafer, of the method utilized to provide the inventive interconnect structure depicted in FIGS. 3–5($b$).

Reference is first made to FIG. 6, which illustrates a device interconnect level 99 atop a semiconducting wafer 12. The device interconnect level 99 includes a first interlevel dielectric 14 having a plurality of openings that are filled with at least one conductive material 13.

The semiconductor wafer (or substrate) 12 may include any number of active and/or passive devices (or regions) located within the wafer or on a surface thereof. For clarity, the active and/or passive devices (or regions) are not shown in the drawings, but are nevertheless meant to be included with wafer 12. The initial wafer (or substrate) is composed of materials well known to those skilled in the art, and conventional processes are employed in fabricating the initial structure. The wafer can have any crystallographic orientation such as (100), (110) or (111). Hybrid substrates having at least two planar surfaces of different crystallographic orientation are also contemplated.

For example, the semiconductor wafer 12 may comprise any conventional semiconductor material including, but not limited to: Si, Ge, SiGe, SiC, SiGeC, InAs, GaAs, InP and other III/V compound semiconductors. The semiconductor wafer 12 may also be composed of a silicon-on-insulator (SOI) material that includes a buried insulating region, such as a buried oxide region, which electrically isolates a top SOI material layer from a bottom Si-containing substrate. SiGe-on-insulators (SGOIs) are also contemplated herein.

The device interconnect level 99 is formed atop the semiconducting wafer 12 using deposition, etching and planarization. More specifically, a first interlevel dielectric 14 is formed atop the semiconducting layer 12. The first interlevel dielectric 14 is formed by a deposition process including, for example, chemical vapor deposition (CVD), plasma-assisted CVD, evaporation, spin-on coating, or chemical solution deposition.

The first interlevel dielectric 14 includes any suitable insulating material that is typically employed in interconnects to electrical devices. This includes inorganic dielectrics, organic dielectrics and combinations, including, multilayers thereof. Illustrative examples of suitable materials for first interlevel dielectric 14 include, but are not limited to: $SiO_2$, fluorinated $SiO_2$, organic thermoset or thermoplastic dielectrics such as polyimides, polyarylenes, benzocyclobutenes and the like, spun-on glasses including organosilicate glass (OSG), with or without porosity, such as hydrogen silsesquixoane, methyl silsesquixoane, tetraethylorthosilicate (TEOS) and the like, amorphous alloys of Si, O, C and H, or SiCOH, amorphous alloys of Si, O, F and H.

Preferably, the first interlevel dielectric 14 comprises a low-k dielectric having a thickness ranging from about 10 nm to about 1000 nm, preferably being 300 nm. The dielectric constant of the first interlevel dielectric 14 may be less than about 3.5, preferably ranging from about 1.0 to about 3.0. Low-k dielectrics may include organic dielectrics such as low dielectric constant polymer dielectrics or may include low dielectric constant carbon-doped oxides. One example of a low-k dielectric polymer dielectric is SiLK™ (trademark of The Dow Chemical Company). Specifically, SiLK™ is a class of polymer-based low-k dielectric materials comprising a b-staged polymer having a composition including about 95% carbon. An example of a low dielectric constant carbon doped oxide is SiCOH.

After forming the first interlevel dielectric 14 on a surface of semiconductor wafer 12, openings are formed into the first interlevel dielectric 14 so as to expose portions of the underlying semiconductor wafer 12, in which d&vice interconnects 99 are subsequently formed. The openings are formed utilizing conventional lithography and etching.

The lithographic step includes applying a photoresist to the first interlevel dielectric 14, exposing the photoresist to a pattern of radiation and developing the pattern into the exposed photoresist utilizing a conventional resist developer. The etching step used in providing the openings into first interlevel dielectric 14 includes chemical reactive ion etching (RIE), plasma etching, ion beam etching or laser ablation.

Following etching, the photoresist is typically removed from the structure utilizing a conventional resist stripping process. Device interconnects 99 are then formed within the openings in the first interlevel dielectric 14 using deposition and planarization processes. In a preferred embodiment, each device interconnect 99 comprises a via diffusion barrier lining 11 and a conductive material 13.

Still referring to FIG. 6, a via diffusion barrier 11 is deposited atop the horizontal and vertical surfaces of the opening within the first interlevel dielectric 14 including the exposed upper surface of the semiconductor wafer 12 to provide electrical contacts to the devices positioned therein. The via diffusion barrier 11 may comprise Ta, TaN, W or WN. The via diffusion barrier 11 may have a thickness ranging from about 2 nm to about 50 nm, preferably being 10 nm. The via diffusion barrier 11 having the above-disclosed thickness may be deposited by sputter deposition. The via diffusion barrier 11 prevents the electro-migration of a conductive metal into the first interlevel dielectric.

Following the formation of the via diffusion barrier 11, a conductive material 13, such as Cu, Ti, TiN, TiW, Ta, TaN, W, Al, Pd, and the like, as well as combinations thereof, is then formed utilizing a conventional deposition process, such as plating or sputtering, filling at least the openings. A highly preferred conductive material 13 used in the present application is Cu. In some instances, conductive material 13 is also formed atop the first interlevel dielectric 14 during the filling process. After filling the openings with a conductive material 13, the structure is typically subjected to a conventional planarization process, such as chemical-mechanical polishing or grinding, to provide a planar structure, as depicted in FIG. 6. Note that each top surface of conductive material 13 is substantially coplanar with the abutting top surface of first interlevel dielectric layer 14.

Typically, the exposed surface of conductive material 13 will contain contaminants such as, for example, oxides of the metal conductor, which can lead to inferior adhesion of the inventive diffusion barrier to the conductive elements. Thus, it is preferred, but not required, in the present invention to remove substantially all of the contaminants prior to formation of the diffusion barrier. The removal of substantially all of the contaminants is carried out at this point of the inventive process by subjecting the structure depicted in FIG. 6 to plasma cleaning by injecting a gas flow of, e.g., pure $NH_3$ or a gas mixture containing a nitrogen-containing gas such as, for example, $N_2$ or $NH_3$, with optional other gases into a CVD reactor, such as a parallel plate, to form a plasma which removes substantially all of the contaminants. Alternatively, a gas mixture containing hydrogen, helium or argon may be used for cleaning. This cleaning step may be performed following the deposition of any conductive material.

An etch stop layer 4 may then be formed atop the device interconnect level 99 by conventional chemical vapor deposition processes. The etch stop layer 4 may comprise nitride or oxynitride materials, i.e., silicon nitride ($Si_3N_4$ or $SiO_xN_y$), having a thickness ranging from about 10 nm to about 100 nm, preferably being about 50 nm. The etch stop layer 4 most preferably comprises $Si_3N_4$. The etch stop layer 4 may be omitted so long as etch selectivity between the device interconnect level 99 and the metal wiring level 100 is maintained.

In highly preferred embodiments, and when Cu is employed as the conductive material 13 of the device interconnects 99, a cap layer (not depicted) may be deposited atop the first interlevel dielectric 14 after forming the device interconnects 99. The optional cap layer comprises a nitride, oxynitride or any combination thereof. The optional cap layer is formed by a deposition process or by thermal nitridation or oxynitridation process. The optional cap layer typically has a thickness from about 5 nm to about 90 nm, with a thickness of from about 20 nm to about 60 nm being more typical. A cap layer may be formed following any of the copper depositions disclosed herein.

Optionally, adhesion promoters may be used to enhance adhesion of the device interconnect level 99 to the subsequently formed dielectric layers, such as the dielectric cap, etch stop layer 4 or the intralevel dielectric 17 of the subsequently formed metal wiring level 100. The adhesion promoter may be applied onto the interlevel dielectric 14 of the device interconnect level 99 prior to the formation of the metal wiring level 100 or codissolved in the solution containing the intralevel dielectric 17 of the metal wiring level 100 prior to deposition. The adhesion promoter is typically a silane-containing compound. In addition, an antistriation agent may be optionally be incorporated to increase film uniformity.

Referring to FIGS. 7–10(b), and in a next series of process steps, a metal wiring level 100 is formed atop the device interconnect level 99 using deposition, etching and planarization. The metal wiring level 100 comprises a metal line 20 separated from an intralevel dielectric 17 by a metal diffusion barrier liner 21.

Figure 7:
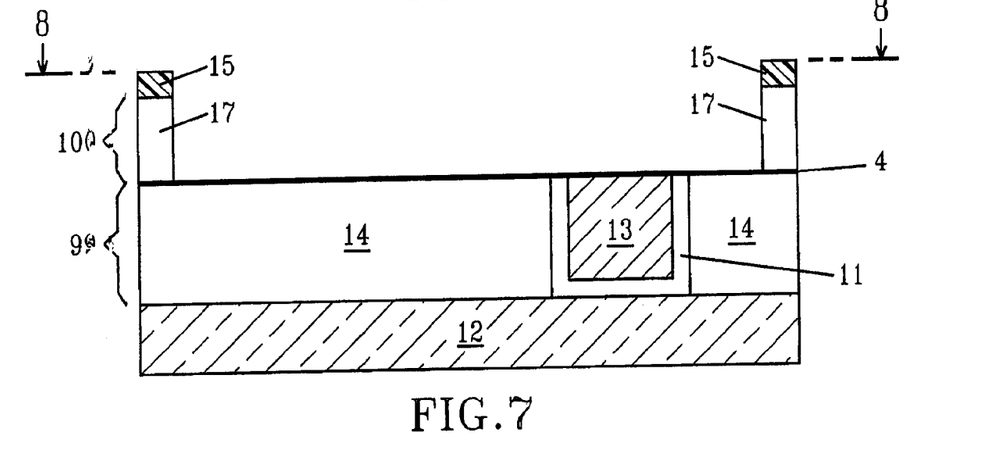
FIG. 7 illustrates (through a side profile) patterning of an intralevel dielectric atop a device interconnect level.

Referring to FIG. 7, and in a first step, an intralevel dielectric 17 is deposited atop the device interconnect level 99 using deposition processes similar to those utilized in forming the first interlevel dielectric 14. The intralevel dielectric 17, similar to the first interlevel dielectric 14, may comprise any insulating material typically utilized in interconnects to electrical devices and can have a thickness ranging from about 10 nm to about 1000 nm. The intralevel dielectric 17 may comprise the same or a different material from the first interlayer dielectric 14.

In some embodiments, a planarization stop layer (not depicted) may be deposited atop the intralevel dielectric 17. The planarization stop layer comprises a nitride, oxynitride or any combination thereof. The planarization stop layer is formed by a deposition process or by thermal nitridation or oxynitridation process. The planarization stop layer typically has a thickness from about 5 nm to about 90 nm, with a thickness of from about 20 nm to about 60 nm being more typical.

In a next process step, the intralevel dielectric 17 is etched to provide trenches for the subsequently formed metal lines using conventional photolithography and etching. First, an anti-reflective coating (ARC) (not shown) may be spin applied to the upper surface of the intralevel dielectric 17 and baked. Alternatively, the anti-reflective coating (ARC) may be omitted. A resist 15 patterned to etch the intralevel dielectric 17 is then produced by applying a layer of photoresist to the surface to be etched; exposing the layer of photoresist to a pattern of radiation; and then developing the pattern into the photoresist utilizing a conventional resist developer.

Figure 8A:
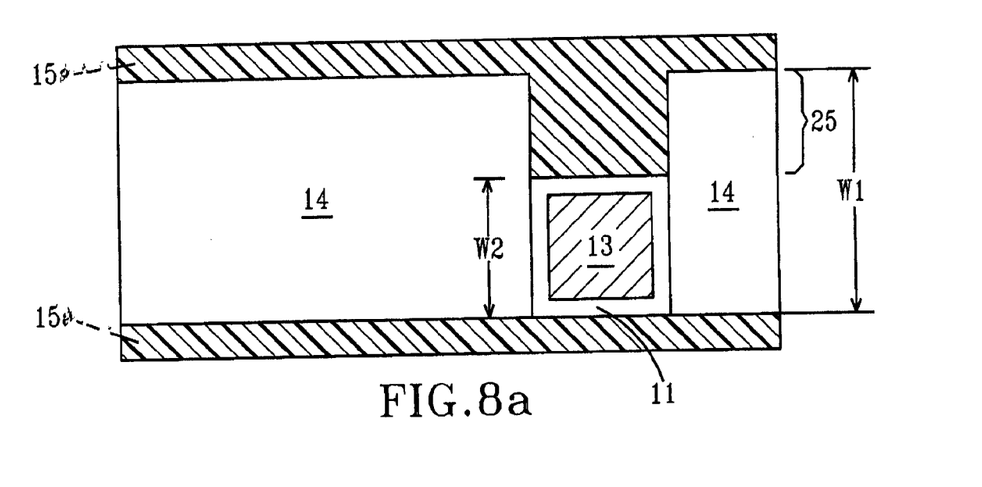

Referring to FIG. 8(a), and in one embodiment of the present invention, the resist 15 is patterned atop the intralevel dielectric 17 to provide an etch mask 15(a) that produces trenches having a notched portion 25, in which the notched portion 25 of the trench has a lesser width W2 than the remaining portion of the trench W1. In this embodiment, the sidewalls of the notched portion 25 of the trench is aligned to the via diffusion barrier 11 of the underlying via interconnect 10.

Figure 8B:
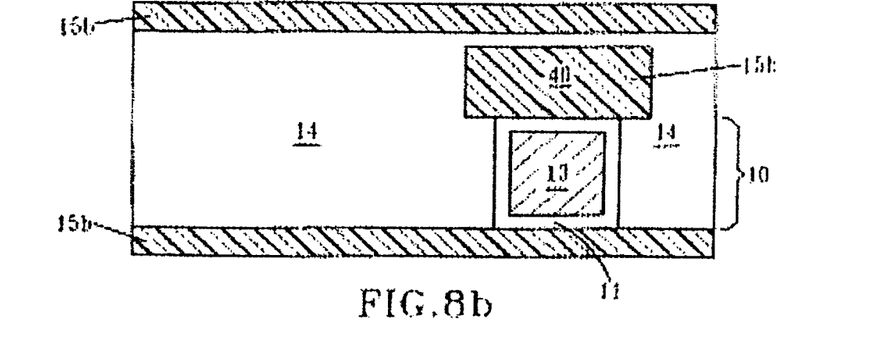

Referring to FIG. 8(b), and in another embodiment of the present invention, the resist 15 is patterned atop the intralevel dielectric 17 to provide an etch mask 15(b) that produces trenches having a mesa portion 40 of intralevel dielectric 17 within the perimeter of the subsequently formed metal lines 20. In this embodiment, the mesa portion 40 of the intralevel dielectric 17 is aligned to the via diffusion barrier lining 11 of the underlying via interconnect 10.

Following photoresist patterning and development, the exposed portions of the antireflective coating and the intralevel dielectric 17 are etched using a directional etch process, i.e., reactive ion etching, selective to the etch stop layer 4. The resist is then removed using a conventional chemical strip, in a next process step, the exposed portions of the etch stop layer 4 are removed by a direction etch process, i.e., reactive ion etching, selective to the interlevel dielectric 14, the via interconnect 10 and the remaining portions of the intralevel dielectric 17 wherein the remaining portion of the intralevel dielectric 17 functions as an etch mask.

Figure 9:
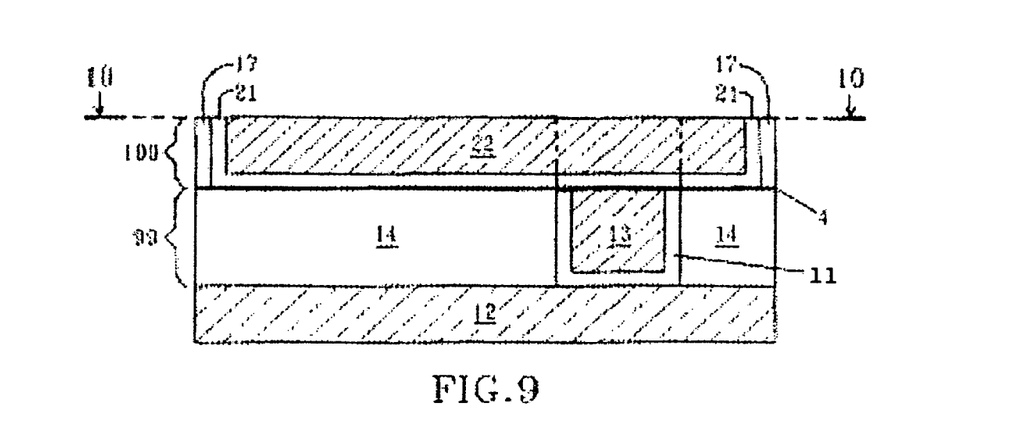
FIG. 9 illustrates (through a side-profile view) forming a metal line level atop the structure depicted in FIG. 7.

Referring to FIG. 9, a metal diffusion baffler 21 is then found on the horizontal and vertical surfaces of the trenches within the interlevel dielectric 17 including the upper surface of the first via interconnect 10. in the embodiment of the present invention in which the mesa portion 40 of the intralevel dielectric 17 is present, the metal diffusion barrier 21 is also formed along the sidewalls of the mesa portion 40 of intralevel dielectric 17. The metal diffusion barrier 21 may comprise Ta, TaN, W or WN. The metal diffusion baffler 21 may have a thickness ranging from about 2 nm to about 50 nm, preferably being 10 nm The metal diffusion barrier lining 21 having the above-disclosed thickness may be deposited by physical deposition, such as sputter deposition. Alternatively, the metal diffusion baffler lining 21 may be deposited by chemical vapor deposition.

Following metal diffusion barrier 21 formation, a metal line 20 is then formed by depositing a metal within each trench of the intralevel dielectric 17. The metal preferably comprises copper and alloys thereof. The metal may be deposited by sputter deposition or by electroplating. Preferably, copper is deposited in a two-step process beginning with forming a copper seed layer (not shown) by sputter deposition and then electroplating copper atop the copper seed layer.

Following metal deposition, the deposited metal is then planarized back and polished using chemical mechanical polishing techniques or similar planarization methods. In a preferred embodiment, the structure is planarized by chemical mechanical polishing or like process stopping on the planarization stop layer. The planarization stop layer is then removed by a highly selective etch to provide a metal wiring level 100 having a substantially planar upper surface, as depicted in FIG. 9.

Figure 10A:
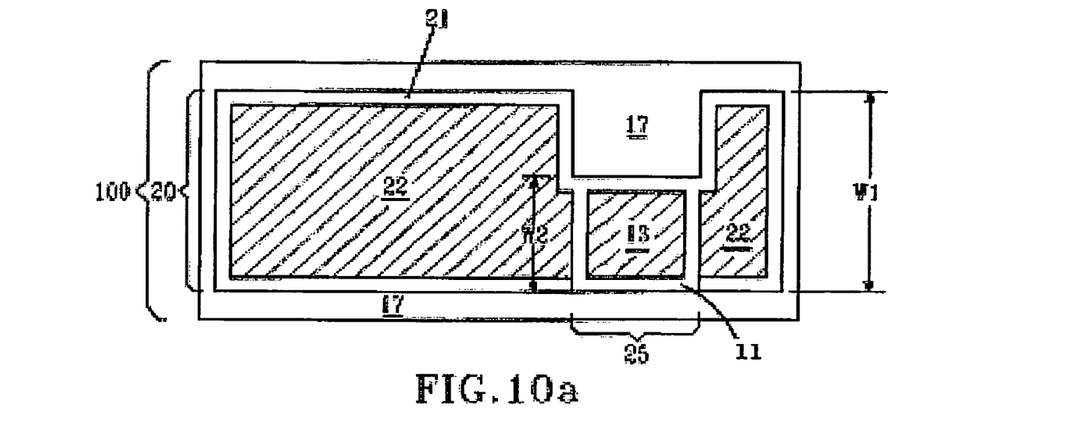

Referring now to FIG. 10(a), which represents the cross-section along section line 10—10 of the structure depicted in FIG. 9, in one embodiment of the present invention the metal line 20 comprises a notch portion 25 aligned to the device interconnect 99, in which the portion of the metal line diffusion barrier 21 within the notched portion 25 of the metal line 20 is in direct contact with the via diffusion barrier 11 to provide a continuous diffusion barrier between the metal wiring level 100 and the device interconnect level 99. The continuous diffusion barrier functions as a barrier to the electro-migration of copper from the interface between the metal lines 20 and device interconnect 99.

Figure 10B:
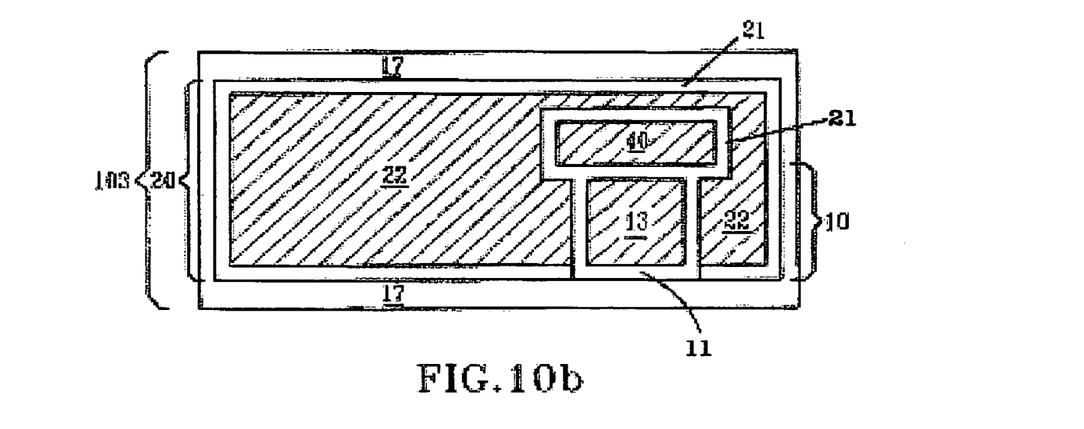

Referring now to FIG. 10(b), which represents the cross-section along section line 10—10 of the structure depicted in FIG. 9 of another embodiment of the present invention, the metal line 20 comprises a mesa portion 40 of intralevel dielectric aligned to the device interconnect 99, in which the portion of the metal line diffusion barrier 21 along the sidewalls of the mesa portion 40 of intralevel dielectric 17 is in direct contact with the via diffusion barrier 11 to provide a continuous diffusion barrier between the metal wiring level 100 and the device interconnect level 99. The continuous diffusion barrier functions as a barrier to the electro-migration of a conductive metal from the interface between the metal lines 20 and the device interconnect 99.

Figure 11:
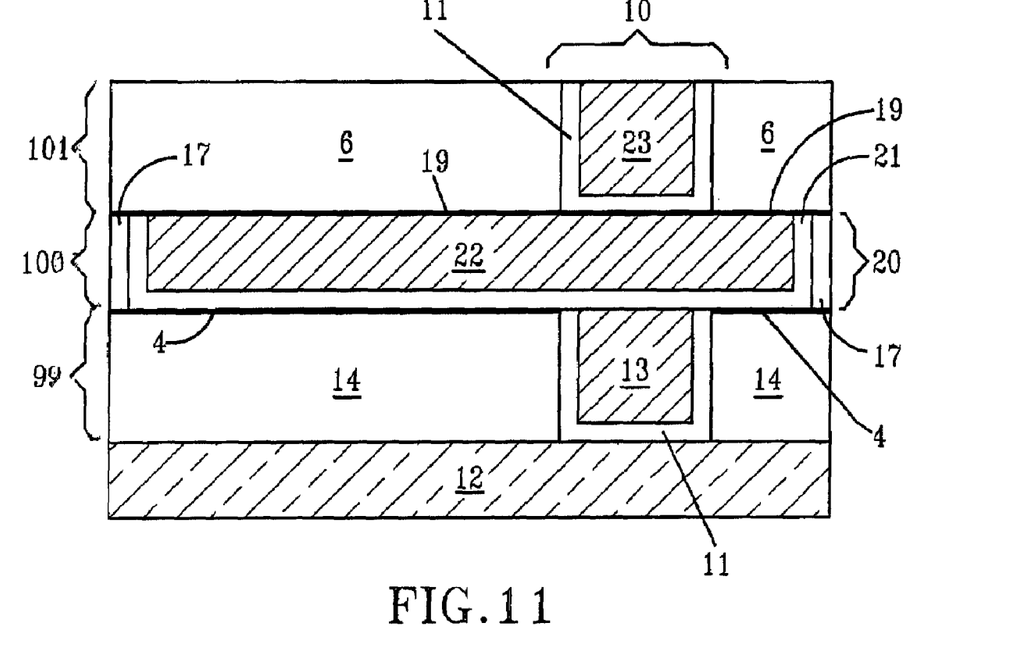
FIG. 11 illustrates (through a side profile) forming an interconnect level atop the structure depicted in FIG. 9.

Referring to FIG. 11, a second etch stop layer 19 may then be formed atop the metal line level 100 by conventional chemical vapor deposition processes. Similar to the first etch stop layer 4, the second etch stop layer 19 may comprise nitride or oxynitride materials, i.e., silicon nitride ($Si_3N_4$ or $SiO_xN_y$), having a thickness ranging from about 10 nm to about 100 nm, preferably being 50 nm. The etch stop layer may be omitted so long as etch selectivity between the via interconnect level 101 and the metal wiring level 100 is maintained.

In a next series of process steps, a via interconnect level 101 is formed atop the metal wiring level 100 using deposition, etching and planarization. More specifically, a second interlevel dielectric 6 is formed atop the surface of the metal wiring level 101. The second interlevel dielectric 6 is formed by a deposition process including, for example, chemical vapor deposition (CVD), plasma-assisted CVD, evaporation, spin-on coating, or chemical solution deposition.

Similar to the first interlevel dielectric 14 and the intralevel dielectric 17, the second interlevel dielectric 6 includes any suitable insulating material that is typically employed in interconnects to electrical devices. The second interlevel dielectric 6 may comprise the same or a different dielectric from the first interlevel 14 and the intralevel dielectric 17.

Preferably, the second interlevel dielectric 6 comprises a low-k dielectric having a thickness ranging from about 10 nm to about 1000 nm, preferably being 300 nm. The dielectric constant of the first interlevel dielectric 14 may be less than about 3.5, preferably ranging from about 1.0 to about 3.0.

After forming the second interlevel dielectric 6 on a surface of the metal wiring level 100, openings are formed into the second interlevel dielectric 6 so as to expose portions of the underlying metal lines 20, in which via interconnects 10 to the underlying lines are subsequently formed. The openings for via interconnects 10 to the metal lines 20 are formed using conventional photolithography and etching. Similar to the device interconnect level 99, a resist is first deposited and patterned atop the second interlevel dielectric 6 by applying a layer of photoresist to the surface to be etched, exposing the layer of photoresist to a pattern of radiation and then developing the pattern to provide an etch mask. Thereafter, the second dielectric layer 6 is etched using an etch chemistry selective to the etch mask.

Similar to the device contacts formed within the openings in the first interlevel dielectric to the substrate 12, the via interconnects 10 are then formed within the opening to the metal lines using conventional deposition and planarization processes. The via interconnect 10 comprises a highly conductive metal 23, such as copper, and a via diffusion barrier 11. The highly conductive metal 23 of the via interconnect 10 is separated from the interlevel dielectric 6 by the via diffusion barrier 11.

Referring now to FIG. 5(a), which represents the cross-section along section line 5—5 of one embodiment of the structure depicted in FIG. 11, the second dielectric layer 6 is patterned to provide openings that are aligned with the notched portion 25 of the metal lines 20 in the underlying metal line level 100. In a next process step, a via diffusion barrier 11 is deposited within the via openings, wherein the via diffusion barrier 11 is in direct contact with the metal diffusion barrier 21 within the notched portion 25 of the metal lines 20 to provide a continuous diffusion barrier between the via interconnect level 101 and the metal line level 100. The continuous diffusion barrier functions as a barrier to the electro-migration of a conductive metal from the interface between the metal lines 20 and the via interconnect 10.

Following the formation of the via diffusion barrier lining 11, a highly conductive metal is formed within the via openings. The metal preferably comprises copper and alloys thereof. The metal may be deposited by sputter deposition or by electroplating. Preferably, copper is deposited in a two-step process beginning with forming a copper seed layer (not shown) by sputter deposition and then electroplating copper atop the copper seed layer. In a next process step, the deposited metal 23 is planarized using chemical mechanical polishing or like processes to provide the structure depicted in FIG. 11.

Referring now to FIG. 5(b), which represents the cross-section along section line 5—5 of another embodiment of the structure depicted in FIG. 11, the resist is patterned atop the second interlevel dielectric 6 to provide an etch mask that produces via openings aligned with the mesa portion 40 of the metal lines 20 of the metal line level 103. In a next process step, a via diffusion barrier 11 is deposited within the via openings, wherein the via diffusion barrier 11 is in direct contact with the metal diffusion barrier 21 along the sidewalls of the mesa portion 40 of interlevel dielectric to provide a continuous diffusion barrier between the via interconnect level 101 and the metal line level 103. The continuous diffusion barrier functions as a barrier to the electro-migration of copper from the interface between the metal lines 20 and the via interconnect 10.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An integrated circuit comprising:
   a metal wiring level comprising metal lines within an intralevel dielectric, said metal lines having a first portion with a first width and a notch portion having a second width, wherein said first width is greater than said second width, and wherein said metal lines are separated from said intralevel dielectric by a metal diffusion barrier that is located underneath the metal lines and along sidewalls of the metal lines; and
   an interconnect wiring level atop said metal wiring level comprising a via interconnect within an interlevel dielectric, wherein said via interconnect is separated from said interlevel dielectric and in electrical contact to said metal lines of said metal wiring level through a via diffusion barrier that is located underneath the via interconnect and along sidewalls of thy via interconnect, wherein said via diffusion barrier contacts said metal diffusion barrier within said notch portion of said metal lines to form a continuous diffusion barrier between the via interconnect and the notch portion of the metal lines.

2. The interconnect structure of claim 1 wherein said intralevel dielectric and said interlevel dielectric comprise materials having a dielectric constant of about 3.5 or less.

3. The interconnect structure of claim 1 wherein said metal lines and said via interconnects comprise copper, aluminum, gold, silver, or alloys thereof.

4. The interconnect structure of claim 1 wherein said via diffusion barrier and said metal diffusion barrier comprise: tantaulum, tungsten, ruthenium, cobalt, titanium, or nitrides thereof.

5. The interconnect structure of claim 1 wherein said via diffusion barrier and said metal diffusion barrier have a thickness ranging from about 5 nm to about 100 nm.

6. An integrated circuit comprising:
   a metal wiring level comprising metal lines within an intralevel dielectric, wherein a mesa portion of said intralevel dielectric is positioned within a portion of said metal lines, wherein said metal lines are separated from said intralevel dielectric, including said mesa portion of said intralevel dielectric, by a moral diffusion barrier that is located underneath the metal lines arid along sidewalls of the metal lines; and
   an interconnect wiring level atop said metal wiring level comprising a via interconnect within an interlevel dielectric, wherein said via interconnect is separated from said interlevel dielectric and in electrical contact to said metal lines of said metal wiring level through a via diffusion barrier that is located underneath the via interconnect and along sidewalls of the via interconnect, wherein said via diffusion barrier contacts said metal diffusion barrier within said mesa portion of said intralevel dielectric to form a continuous diffusion barrier between the via interconnect and the mesa portion of the intralevel dielectric.

7. The interconnect structure of claim 6 wherein said intralevel dielectric, including said mesa portion of said interlevel dielectric, comprises materials having a dielectric constant of about 3.5 or less.

8. The interconnect structure of claim 6 wherein said metal lines and said via interconnects comprise copper, aluminum, gold, silver, or alloys thereof.

9. The interconnect structure of claim 6 wherein said via diffusion barrier and said metal diffusion barrier comprise: tantalum, tungsten, ruthenium, cobalt, titanium, or nitrides thereof.

10. The interconnect structure of claim 6 wherein said via diffusion barrier and said metal diffusion barrier have a thickness ranging from about 5 nm to about 100 nm.

* * * * *